United States Patent
Bhattacharya et al.

(10) Patent No.: US 9,622,374 B2
(45) Date of Patent: Apr. 11, 2017

(54) ELECTRICAL EQUIPMENT AND A METHOD OF MANUFACTURING

(71) Applicant: GENERAL ELECTRIC COMPANY, Schenectady, NY (US)

(72) Inventors: Anandaroop Bhattacharya, Bangalore (IN); Subhasish Dasgupta, Bangalore (IN); Peter James Greenwood, Cheshire, CT (US); Steven Edward Meiners, Cary, NC (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 0 days.

(21) Appl. No.: 14/814,560

(22) Filed: Jul. 31, 2015

(65) Prior Publication Data
US 2016/0044823 A1    Feb. 11, 2016

(30) Foreign Application Priority Data
Aug. 8, 2014 (IN) .......................... 3920/CHE/2014

(51) Int. Cl.
*H05K 7/20* (2006.01)
*H02B 1/56* (2006.01)
(Continued)

(52) U.S. Cl.
CPC .......... *H05K 7/20009* (2013.01); *H02B 1/56* (2013.01); *H05K 5/0213* (2013.01); *H05K 7/2089* (2013.01); *H02B 1/21* (2013.01)

(58) Field of Classification Search
USPC ........................................ 174/162; 361/700
See application file for complete search history.

(56) References Cited

U.S. PATENT DOCUMENTS

| 5,101,080 A | 3/1992 | Ferenc |
| 5,467,250 A * | 11/1995 | Howard ............... H05K 7/206 165/122 |

(Continued)

FOREIGN PATENT DOCUMENTS

| CN | 202308972 U | 7/2012 |
| DE | 29720765 U1 | 1/1998 |

(Continued)

OTHER PUBLICATIONS

John, "Estimating Busbar Temperatures", Industry Applications, IEEE Transactions on (vol. 26, Issue: 5), pp. 926-934, Oct. 1990.

(Continued)

*Primary Examiner* — William H Mayo, III
*Assistant Examiner* — Krystal Robinson
(74) *Attorney, Agent, or Firm* — GE Global Patent Operation; Stephen G. Midgley

(57) ABSTRACT

Electrical equipment that includes a cabinet comprising a plurality of walls is provided. The cabinet is disposed around a plurality of electric components such as conductors. Further, the electrical equipment also includes at least one barrier. The barrier is disposed in the cabinet and spaced apart from the conductor by a spacing distance to define a channel within the cabinet for air to flow between the barrier and the conductor. The barrier is placed such that a portion of the barrier is coupled to one of the plurality of walls of the electric cabinets.

10 Claims, 6 Drawing Sheets

(51) Int. Cl.
*H05K 5/02* (2006.01)
*H02B 1/21* (2006.01)

(56) References Cited

U.S. PATENT DOCUMENTS

| | | | |
|---|---|---|---|
| 5,598,322 A * | 1/1997 | Von Arx | H02B 1/052 |
| | | | 361/704 |
| 5,657,641 A * | 8/1997 | Cunningham | H05K 7/20681 |
| | | | 361/691 |
| 6,018,455 A | 1/2000 | Wilkie et al. | |
| 6,082,441 A | 7/2000 | Boehmer et al. | |
| 6,433,271 B1 | 8/2002 | Arnborg | |
| 6,643,123 B2 | 11/2003 | Hartel et al. | |
| 7,095,606 B2 | 8/2006 | Mahn et al. | |
| 7,199,318 B2 | 4/2007 | Buxton et al. | |
| 7,329,813 B2 | 2/2008 | Josten et al. | |
| 7,586,058 B2 | 9/2009 | Kozar et al. | |
| 7,637,118 B2 | 12/2009 | Nicolai et al. | |
| 7,798,892 B2 | 9/2010 | Aiello et al. | |
| 7,814,760 B2 | 10/2010 | Immel et al. | |
| 7,821,774 B2 | 10/2010 | Josten et al. | |
| 7,974,078 B2 | 7/2011 | Coomer et al. | |
| 8,081,464 B2 | 12/2011 | Mauroux et al. | |
| 8,229,289 B2 | 7/2012 | Schneider et al. | |
| 8,243,453 B2 | 8/2012 | Van et al. | |
| 8,437,118 B2 | 5/2013 | Kasza et al. | |
| 8,481,881 B2 | 7/2013 | Saxl et al. | |
| 2003/0168949 A1 * | 9/2003 | Hales | H05K 7/186 |
| | | | 312/223.1 |
| 2005/0231915 A1 * | 10/2005 | Keenan | H05K 7/20572 |
| | | | 361/700 |
| 2006/0120027 A1 * | 6/2006 | Josten | H02B 1/14 |
| | | | 361/624 |
| 2007/0165375 A1 | 7/2007 | Nicolai et al. | |
| 2009/0212022 A1 | 8/2009 | Josten et al. | |
| 2010/0226073 A1 | 9/2010 | Nicolai et al. | |
| 2010/0309630 A1 | 12/2010 | Jones et al. | |
| 2012/0297798 A1 | 11/2012 | Kaufmann et al. | |

FOREIGN PATENT DOCUMENTS

| | | |
|---|---|---|
| EP | 1116309 A1 | 7/2001 |
| EP | 1667179 A2 | 6/2006 |
| EP | 1667180 A1 | 6/2006 |
| GB | 2085238 A | 4/1982 |

OTHER PUBLICATIONS

Schmidt et al, "Modelling of the Quench Process for the Optimisation of the Design and Protection of Superconducting Busbars for the Lhc", European Organization for Nuclear Research European Laboratory for Particle Physics, Eighteenth International Cryogenic Engineering Conference (ICEC 18), pp. 1-4, Feb. 2000.

European Search Report and Opinion issued in connection with corresponding EP Application No. 15179574.7 dated Dec. 11, 2015.

* cited by examiner

ELECTRICAL EQUIPMENT AND A METHOD OF MANUFACTURING

BACKGROUND

The present invention relates generally to electrical equipment and, more particularly, to cooling systems for an electrical component of electrical equipment.

Switchgear assemblies and switchboards and panel boards are general terms which cover electrical equipment such as fuses and circuit breakers, along with associated control, instrumentation and metering devices. Such assemblies typically include associated conductors (for example, busbars), interconnections and supporting structures used for the distribution of electrical power. Each component in these assemblies is generally required to operate within predetermined parameter ranges associated with temperatures. For example, an upper temperature rise limit in electrical cabinets is defined. The operating temperature of electrical cabinets is dependent on, among other factors, current flowing through the plurality of copper or aluminum conductors that are physically and electrically isolated from each other. As current is transmitted through the conductors, heat is generated by mechanisms that include $I^2R$ losses. The generated heat can cause the temperature of the cabinets to increase beyond the permissible limits. The increase in temperature can also lead to deterioration of components like insulators. The deterioration of components increases operational costs of the equipment by adding component replacement costs. Further, deterioration of insulation can also lead to an increase in arcing in the equipment and thus increase the risk of equipment failure.

Multiple cooling techniques have been utilized to reduce the temperature of electrical cabinets. Some examples of existing cooling techniques include, but are not limited to, addition of cooling agents such as fans, heat pipes, refrigeration cycles, and pumped liquid loops. These techniques include addition of the cooling agents to the cabinet and placing them in close proximity to the electrical components that may heat. However, addition of these components may lead to reliability issues with respect to the equipment. Further, some cooling agents, such as fans and pumped liquid loops, require additional power to be operated. This adds to the power requirements of the electrical equipment and reduces its overall power efficiency. Moreover, cooling agents may also include electrically conducting material that is placed in close proximity to electrical components thereby increasing chances of arcing and system failures.

Hence, there is a need for electrical equipment with safe as well as effective cooling options.

BRIEF DESCRIPTION

According to one embodiment, electrical equipment is provided. The electrical equipment includes a cabinet comprising a plurality of walls. The cabinet is disposed around a plurality of electric components such as conductors. Further, the electrical equipment also includes at least one barrier. The barrier is disposed in the cabinet and spaced apart from the conductor by a spacing distance to define a channel within the cabinet for air to flow between the barrier and the conductor. The barrier is placed such that a portion of the barrier is coupled to one of the plurality of walls of the electric cabinets.

According to another embodiment, a method for manufacturing electrical equipment. The method includes enclosing a plurality of electrical components of the electrical equipment in a cabinet comprising a plurality of walls. The plurality of electrical components enclosed in the cabinet includes a conductor. Further, the method also includes fixing at least one barrier in the cabinet. The barrier is placed such that the at least one barrier and the conductor are spaced apart by a spacing distance to define a channel within the cabinet for air to flow between the at least one barrier and the conductor.

DRAWINGS

Other features and advantages of the present disclosure will be apparent from the following more detailed description of the preferred embodiment, taken in conjunction with the accompanying drawings which illustrate, by way of example, the principles of certain aspects of the disclosure.

DETAILED DESCRIPTION

Figure 1:
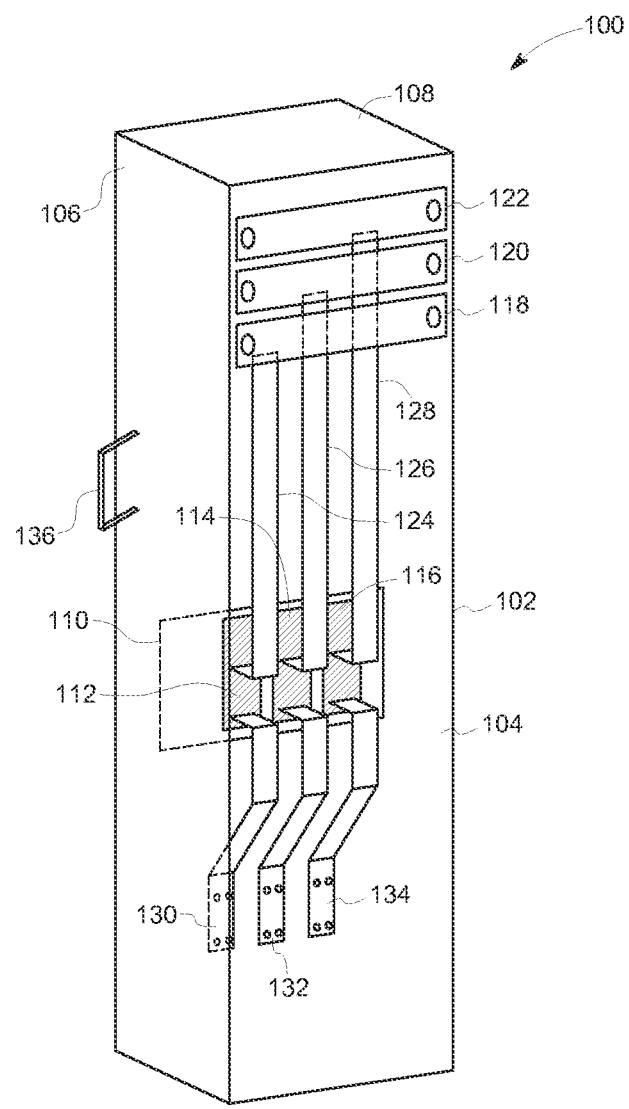
FIG. 1 illustrates a prior art electrical equipment comprising an electrical cabinet.

Reference will be made below in detail to exemplary embodiments of the invention, examples of which are illustrated in the accompanying drawings. Wherever possible, the same reference numerals used throughout the drawings refer to the same or like parts.

Embodiments of the present invention provide for electrical equipment and a method for manufacturing electrical equipment. Electrical equipment, such as circuit breakers and switch gears include multiple current carrying electrical components that are disposed in the equipment for specific functions. Examples of these current carrying components include, but are not limited to, panel boards, fuses, reclosers, conductors such as busbars, and the like. Some components are designated to carry current from one point in the equipment to another. Carrying current may lead to generation of heat in these components. The generated heat in these conductors may lead to deterioration of insulators that are located near the conductors. Embodiments described in the forthcoming paragraphs include electrical equipment that is designed to handle increased temperatures in a cabinet and also a method for manufacturing the electrical equipment. The cabinet is designed to be placed around electrical components in the electrical equipment. In some cases, electrical components in the equipment may be arranged in smaller groups and multiple cabinets may be placed around the smaller groups of electrical components. Further, the electrical equipment includes a barrier that is placed in the cabinet and spaced apart from the electrical component(s). The barrier is placed such that a channel is defined within the cabinet for air to flow between the barrier and the electrical component(s). Further, one end of the barrier is coupled to one of the walls of the cabinet. The barrier used to create the channel may be made from electrically insulating material. When the barrier is placed, air present around the electrical component(s) in the cabinet is directed through the channel. As the air passes through the channel it comes in contact with the electrical component(s). Due to a difference in temperature of the air and the electrical component(s), the temperature of the electrical component(s) is reduced. The air, which is hot after contact with the electrical component(s), may escape through an opening defined in the channel. Due to sudden expansion of the volume available for air after exiting the channel, the hot air also cools and can be reutilized to cool the electrical component(s). The electrical equipment along with one or more barriers is explained in greater detail with the help of the accompanying figures.

FIG. 1 illustrates a prior art electrical equipment 100, such as switchgear, comprising an electrical cabinet 102. The cabinet 102 includes a plurality of walls such as walls 104, 106, and 108. The electrical equipment 100 includes a plurality of electrical components, such as component 110, which are placed in the cabinet 102. Examples of component 110 include, but are not limited to, circuit breakers, fuses, switches, and the like. The electrical components include a plurality of ports, such as ports 112, 114, and 116 associated with component 110. The ports 112, 114, and 116 may be coupled with terminals, for example input terminals 118, 120, and 122 and output terminals (not shown). As illustrated in FIG. 1, the ports 112, 114, and 116 may be coupled to the terminals 118, 120, and 122 through conductors 124, 126, and 128. Further, the ports 112, 114, and 116 may be coupled to the output terminals through conductors 130, 132, and 134.

One of the walls of the cabinet 102 includes a handle or a knob, for example handle 136, to open the cabinet 102 to provide access to the component(s) 110. Further, the cabinet 102 may be made from any material capable of handling high temperatures and different environmental conditions.

The conductors 124, 126, 128, 130, 132, and 134 are made from conducting material such as aluminum or copper. During operation, the conductors 124, 126, 128, 130, 132, and 134 generate heat. The heat generated by the conductors 124, 126, 128, 130, 132, and 134 may cause other components of the equipment 100 to heat.

Figures 2A, 2B:
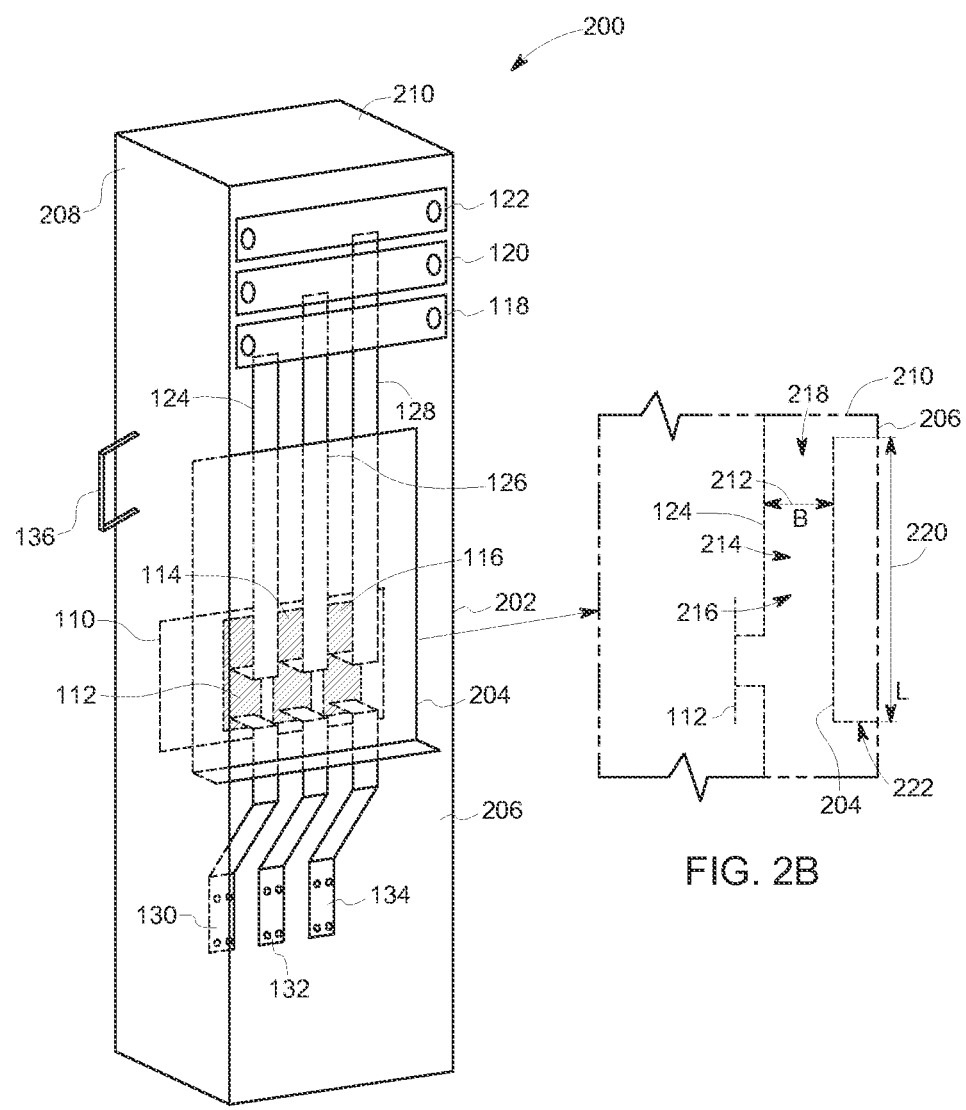
FIGS. 2A and 2B illustrates electrical equipment comprising an electrical cabinet and a barrier, according to an embodiment of the present invention.

FIGS. 2A and 2B illustrates electrical equipment 200 comprising an electrical cabinet 202 and a barrier 204, according to an embodiment of the present invention. As described with respect to cabinet 102 in FIG. 1, the electrical cabinet 202 is placed around electrical components, such as component 110. The electrical cabinet comprises a plurality of walls 206, 208, and 210. The ports 112, 114, and 116 of the component 110 may be coupled to the input terminals 118, 120, and 122 and output terminals (not shown) through conductors 124, 126, 128, 130, 132, and 134. The electrical cabinet 202 may also include a handle or a knob, such as the handle 136 placed on wall 208, to open the cabinet and provide access to the component(s) 110. To explain the design and elements of the electrical equipment 200 a side-view of the equipment 200 has been illustrated in FIG. 2B. Reference numerals illustrated in FIG. 2B have been used along with reference numerals from FIG. 2A to describe the electrical equipment 200.

In accordance with an embodiment of the invention, in order to dissipate heat, one or more barriers, such as the barrier 204, is placed opposite at least one of the conductors 124, 126, 128, 130, 132, and 134. In the illustrated embodiment, the barrier 204 may be placed opposite multiple conductors (for example, conductors 124, 126, and 128) to reduce the number of barriers required to dissipate heat from each conductor in the equipment 200. However, any number of barriers may be employed. The barrier 204 and the conductors are spaced apart from each other by a spacing distance (B) 212. The spacing distance 212 may be a length of a line drawn from a point on the barrier 204 towards one of the conductors 124, 126, and 128 and that is perpendicular to the surface of the barrier 204. Further, the barrier 204 is coupled to at least one wall of the cabinet 202 to define a channel 214 between the barrier 204 and the conductors 124, 126, and 128. For example, as shown in FIG. 2A, the barrier 204 may be coupled to the wall 206 of the cabinet 202.

The channel 214 between the barrier 204 and the conductors 124, 126, and 128 has at least one opening 216 to allow air to enter the channel 214 and another opening 218 to allow air to exit the channel 214. The channel 214 allows air from the vacant spaces in the cabinet 202 to be directed towards the conductors 124, 126, and 128 through the opening 216. The air, as it moves along a surface of the conductors 124, 126, and 128 that is facing the barrier 204, cools the conductors 124, 126, and 128 and exits the channel 214 from the opening 218. Similarly, air may enter the channel 214 from the opening 218 and exit the channel 214 from the opening 216.

The barrier 204, according to certain embodiments, is a sheet of electrically insulating material. Further, the barrier 204 may also include thermally insulating material. Examples of materials that can be used for the barrier 204 include, but are not limited to, Polytetrafluoroethylene (PTFE), Acrylonitrile Butadiene Styrene (ABS), Fiber-Reinforced Plastic (FRP), glass, and the like. The barrier 204 may be of different shapes and sizes. The shape of the barrier is selected such that the conductors 124, 126, and 128 are substantially covered while allowing for air to pass through the channel 214. Examples of shapes of the barrier 204 include, but are not limited to, rectangular, square, trapezoidal, circular, arcuate, tubular, or any other shape to allow the barrier 204 to be placed in the cabinet 202.

Figure 4:
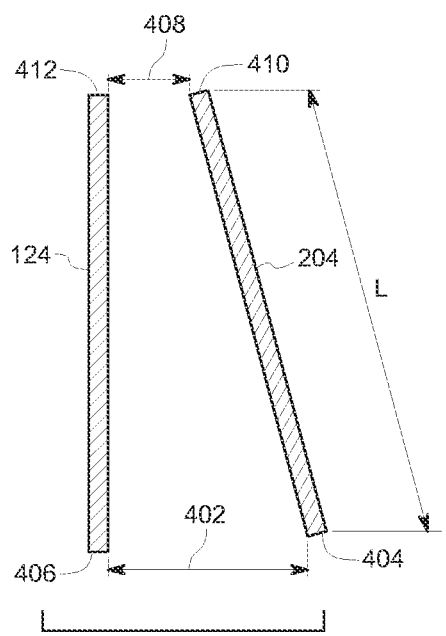
Figure 5:
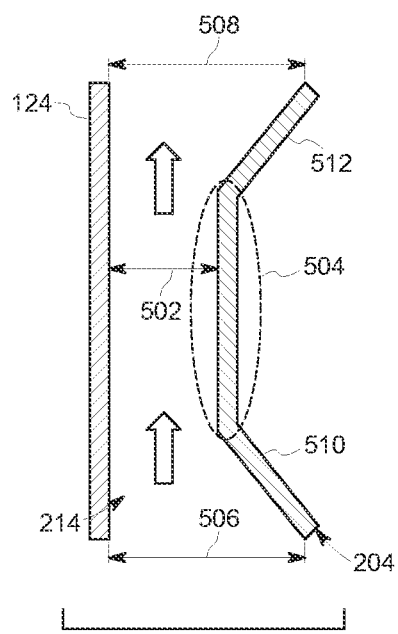

In one embodiment, the barrier 204 may be placed opposite the conductors 124, 126, and 128 such that they are parallel to each other. In other embodiments, as shown in FIGS. 4 and 5, the barrier 204 may be placed opposite the conductors such that the spacing distance 212 changes along a length of the barrier 204.

The barrier 204 is connected to one of the walls, such as the wall 206, of the cabinet 202 by an extended portion 222 of the barrier 204 using any known fastening mechanisms such as welding, industrial adhesives, rivets, screws, bolts, and combinations of bolts and nuts. The barrier 204 may be fabricated such that the extended portion 222 is substantially perpendicular to the remainder of the barrier 204. In other embodiments, the extended portion 222 may be separately fabricated and attached to the barrier 204 at a first end and to one of the walls of the cabinet at a second end.

The efficiency of heat dissipation of the channel 214 is dependent on a ratio between the spacing distance (B) 212 and a measurement of a dimension 220 (L) of the barrier 204. The dimension L of the barrier 204 used for calculation of this ratio is the longitudinal dimension of the side of the barrier 204 that is facing the conductors 124, 126, and 128. For example, when the barrier 204 is rectangular in shape such as in FIG. 2, the dimension 220 used for measurement is the length of the rectangular barrier 204. Similarly, if the barrier 204 is circular in shape, the diameter of the circular barrier 204 may be considered as the dimension 220. In one embodiment, the ratio between B and L is greater than 0.05.

Figure 9:
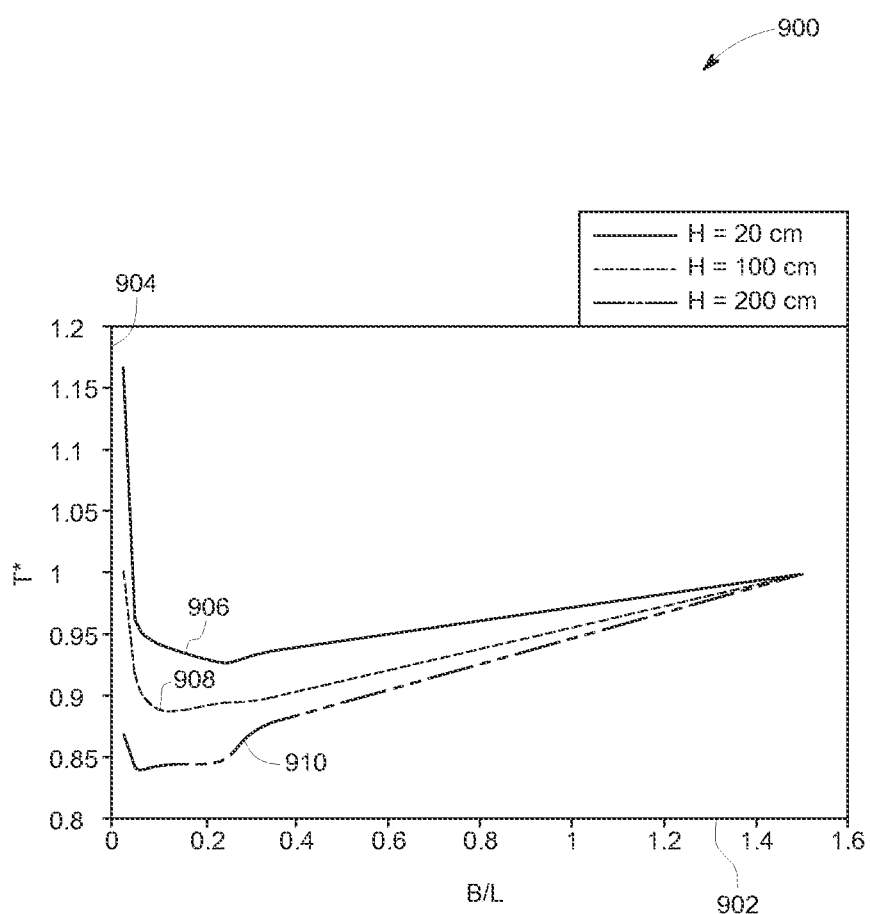
FIG. 9 is a graphical representation of temperature change in electrical components for different ratios between a longitudinal measurement of the barrier and a spacing distance, according to an embodiment of the present invention.

In another embodiment, the ratio between B and L is less than 0.4. FIG. 9 illustrates efficiency of heat dissipation of the equipment 200 against a change of the ratio between B and L.

With continued reference to FIG. 2A, and in accordance with certain embodiments, one of the walls, such as the wall 206, of the cabinet 202 may include a plurality of openings (not shown) to allow ambient air to enter the cabinet 202. The ambient air 202 is then directed through the channel 214 to cool the conductors 124, 126, and 128 and is vented out from the channel 214 in the cabinet 202. The cabinet 202 may also include an exhaust opening (not shown) on one of the walls to allow hot air to exit the cabinet 202.

Figure 3:
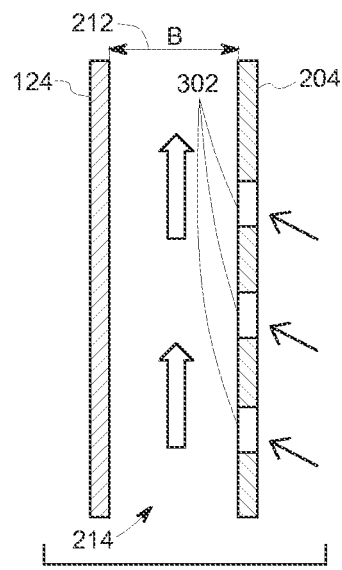
FIGS. 3-5 illustrate different configurations of the barrier, according to some embodiments of the present invention.

Multiple configurations of the barrier 204 can be used to place the barrier 204 opposite one or more conductors. For example, one configuration may include creating multiple openings in the barrier 204 to allow more air to pass through the channel 214 and also cool the hot air moving towards the opening 218 with jets of cooler air from the ambient atmosphere. Examples of such a configuration as well as other configurations are illustrated in FIGS. 3-5. Numerous other configurations of the barrier 204 are possible without departing from the scope of the present technique.

FIG. 3 illustrates a configuration of the barrier 204 that includes a plurality of perforations 302. The perforations 302 allow cooler air from the surroundings to enter the channel 214. The extra air entering the channel 214 allows for faster cooling of the conductor 124. The perforations 302 may be defined at regular intervals along the length of the barrier 204. In certain embodiments, the perforations 302 may be defined in an arbitrary fashion along the length of the barrier 204. In certain embodiments, pumps or actuators may be placed in the perforations 302 to create jets of air present in the surroundings and direct them towards the conductor 124.

FIG. 4 illustrates a configuration of the barrier 204 in which the spacing distance between the barrier 204 and the conductor 124 changes along the dimension 220 of the barrier 204. As illustrated in FIG. 4, a spacing distance 402 between a first end 404 of the barrier 204 and a first end 406 of the conductor 124 is different from a spacing distance 408 between a second end 410 of the barrier 204 and a second end 412 of the conductor 124. The spacing distance 402 may be less than the spacing distance 408, when the barrier 204 is diverging away from the conductor 124 along the dimension (L) 220 of the barrier 204. In another embodiment, the spacing distance 402 may be greater than the spacing distance 408 when the barrier 204 is converging towards the conductor 124 along the dimension 220 of the barrier 204. In both embodiments, the ratio between the dimension 220 of the barrier 204 and the lesser of the two spacing distances 402 and 408 may be greater than 0.05 but less than 0.4.

FIG. 5 illustrates a configuration of the barrier 204 in which the spacing distance between the barrier 204 and the conductor 124 changes along the dimension 220 of the barrier 204. The illustrated configuration may be termed as a venturi profile due to the presence of a constricted section in the channel 214.

A spacing distance 502 between a central region 504 of the barrier 204 and the conductor 124 is at a minimum in comparison with the spacing distance 506 and 508 between the ends 510 and 512 of the barrier 204 and the conductor 124. The barrier 204 may be fabricated such that the sections connecting the ends 510 and 512 and the central region 504 diverge away from the central region 504. As illustrated in FIG. 5, the spacing distances 506 and 508 are equal. However, in certain embodiments, the spacing distance 506 and 508 may be different. The creation of venturi in the channel 214 causes acceleration in the air flowing in the channel thereby effecting faster cooling of the conductor 124.

Figure 6:
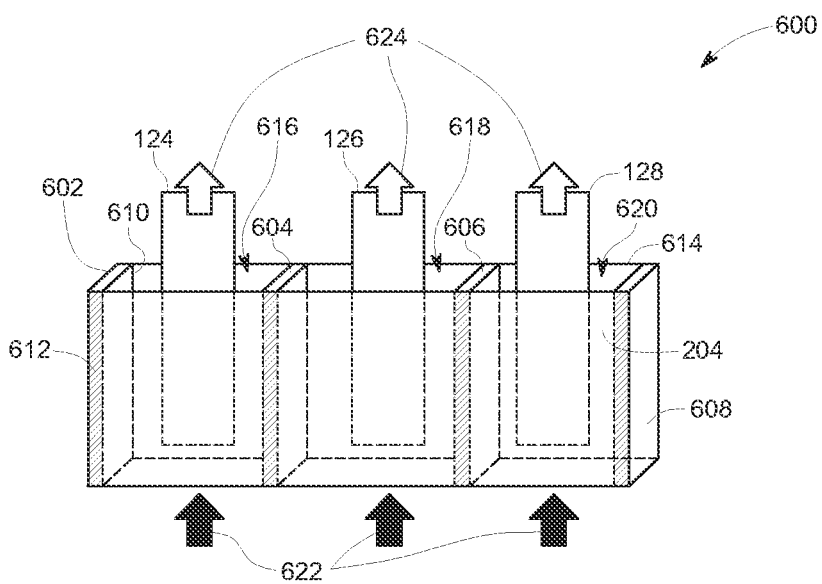
FIGS. 6-7 illustrate electrical equipment comprising the barrier and side barriers, according to some embodiments of the present invention.
Figure 7:
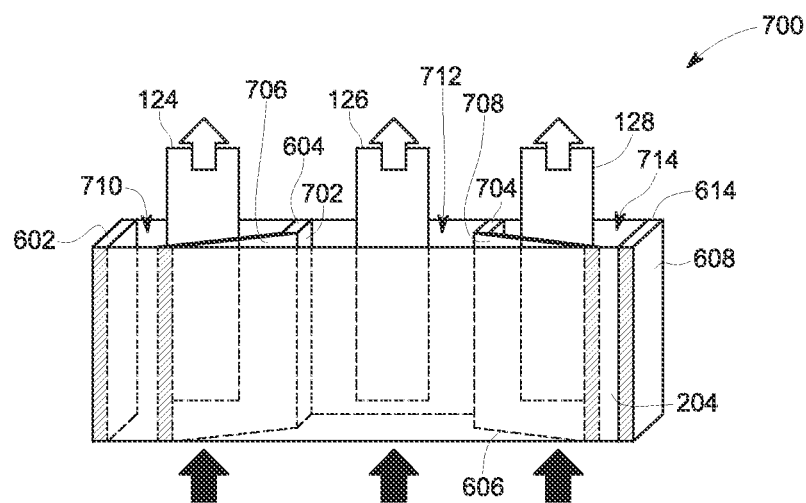

The configurations illustrated in FIGS. 2-5 include various profiles for the barrier 204 to increase efficiency of cooling the conductor 124. In addition to these configurations, additional side barriers may be added to the equipment to isolate the multiple conductors 124, 126, and 128 shown in FIG. 2. FIGS. 6-7 illustrate embodiments of the electrical equipment 200 with additional side barriers.

FIG. 6 illustrates electrical equipment 600 comprising the barrier 204 and side barriers 602, 604, 606, and 608. Each side barrier 602, 604, 606, and 608 includes a plurality of sides 610 and 612. The side barriers 602, 604, 606, and 608 are coupled to a supporting wall 614 on one side and to the barrier 204 on another side. For example, the side 610 of each side barrier 602, 604, 606, and 608 is coupled to supporting wall 614 and the side 612 of each side barrier 602, 604, 606, and 608 is coupled to the barrier 204. The supporting wall 614 is placed in the equipment 600 such that it can support one or more conductors, such as the conductors 124, 126, and 128. The side barriers are coupled to the supporting wall 614 and the barrier 204 to define multiple compartments to isolate the conductors 124, 126, and 128 from each other. As illustrated in FIG. 6, the side barriers 602, 604, 606, and 608 define compartments 616, 618, and 620 for each conductor 124, 126, and 128, respectively.

In an embodiment, the barrier 204 and the side barriers 602, 604, 606, and 608 may be fabricated as a single unit. The single unit may comprise a first surface that may act as the barrier 204 and surfaces perpendicular to the first surface that may act as the side barriers 602, 604, 606, and 608. Further, the first surface of the single unit that acts as the barrier 204 may be arcuate in shape and may define compartments 616, 618, and 620 that are tubular in shape.

In one embodiment, the compartments 616, 618, and 620 may have even geometries when the barrier 204 has a flat surface and is placed in parallel with respect to the conductors 124, 126, and 128. While the illustrated embodiment shows that the barrier 204 has a flat surface, the shape of the barrier 204 may be changed to provide multiple variations in the shape of the compartments 616, 618, and 620.

In certain embodiments, as illustrated in FIG. 6, the distance between the side barrier 604 and the conductors 124 and 126 may be equal. Similarly, the distance between the side barrier 606 and the conductors 126 and 128 may be equal. In this configuration, the volume of the compartments 616, 618, and 620 is equal. However, in other embodiments, the side barriers 604 and 604 may be biased towards one of the conductors 124, 126, and 128 thereby creating compartments 616, 618, and 620 of different volumes.

Air enters each compartment 616, 618, and 620 from one end of the compartments and exits at another. For example, air may enter the compartments 616, 618, and 620 from the end 622. While passing through the channel between the barrier 204 and the conductors 124, 126, and 128 in each compartment 616, 618, and 620, air cools the conductors 124, 126, and 128. The hot air exits each compartment 616, 618, and 620 from another open end in each compartment. For example, the hot air may exit the compartments 616, 618, and 620 from the end 624.

The side barriers 602, 604, 606, and 608 may be made from electrically insulating material. In some embodiments, the side barriers 602, 604, 606, and 608 may also be fabricated from thermally insulating material. Materials that can be used to fabricate the side barriers 602, 604, 606, and 608 may include, but are not limited to, Polytetrafluoroethylene (PTFE), Acrylonitrile Butadiene Styrene (ABS), Fiber-Reinforced Plastic (FRP), glass, and the like.

As shown in FIG. 6, the side barriers 602, 604, 606, and 608 may be placed parallel to each other. However, in certain embodiments (shown in FIG. 7), the side barriers 602, 604, 606, and 608 may converge or diverge from each other.

FIG. 7 illustrates a configuration of the equipment 700 that includes side barriers 602, 604, 606, and 608 that converge and diverge from each other. A distance between the sections of the side barriers 602, 604, 606, and 608 may change along the spacing distance 212 between the barrier 204 and the conductors 124, 126, and 128. For example, as illustrated in FIG. 7, sections 702 and 704 of the side barriers 604 and 606, which are coupled to the supporting wall 614, may be parallel to each other and also parallel to the side barriers 602 and 608. However, sections 706 and 708 may diverge from each other toward the barrier 204 to which they are coupled. In some other embodiments, the sections 706 and 708 may converge towards each other. The compartments 710, 712, and 714 may be of different areas owing to the convergence or divergence of the sections 706 and 708. In other embodiments, the sections 702 and 704 may also converge or diverge from each other further changing the areas of the compartments 710, 712, and 714.

The sections 702 and 706 may be coupled using known fixing mechanisms to define the side barrier 604. Similarly, the sections 704 and 708 may be coupled using known fixing mechanisms to define the side barrier 606. In other embodiments, the side barriers 604 and 606 may be fabricated to include sections 702 and 704 that are parallel to each other and sections 706 and 708 that diverge from each other.

Figure 8:
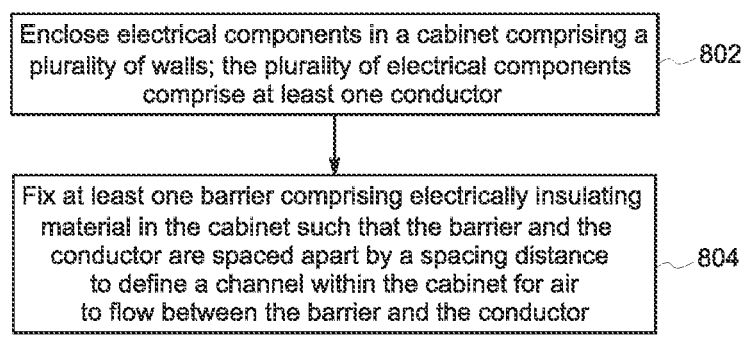
FIG. 8 illustrates a flow diagram of a method of manufacturing electrical equipment comprising the barrier, according to an embodiment of the present invention.

FIG. 8 illustrates a flow diagram of a method of manufacturing electrical equipment comprising the barrier 204, according to an embodiment of the present invention. The method includes, at step 802, enclosing the plurality of components, such as component 110, in a cabinet, like the cabinet 102. The electrical component 110 includes at least one conductor (for example: conductors 124, 126, and 128). The cabinet 102 includes a plurality of walls that include a handle, such as handle 136, to provide access to the enclosed component 110.

Further, the method includes a step 804 of fixing at least one barrier (for example: barrier 204) to at least one of the walls of the cabinet 102. The barrier 204 is fixed in the cabinet 102 such that the barrier 204 is facing at least one of the conductors 124, 126, and 128. Further, the barrier 204 and at least one of the conductors 124, 126, and 128 are spaced apart from each other by a spacing distance to define a channel (for example, channel 214) between the barrier 204 and the conductors 124, 126, and 128. The channel 214 allows ambient air to flow between the barrier 204 and the conductors 124, 126, and 128 thereby cooling the conductors 124, 126, and 128.

The barrier 204 and the conductors 124, 126, and 128, in one embodiment, may be placed parallel to each other such that the spacing distance between the barrier 204 and the conductors 124, 126, and 128 is constant. In another embodiment, the spacing distance between barrier 204 and the conductors 124, 126, and 128 may vary along a longitudinal dimension of the barrier 204. Further, the method may also include defining perforations in the barrier 204 to allow jets of cooler air to enter the channel 214 and cause faster cooling of the conductors 124, 126, and 128.

Further, the method of manufacturing the equipment may also include a step of fixing a plurality of side barriers (for example: side barriers 602, 604, 606, and 608) in the cabinet 102. The side barriers 602, 604, 606, and 608 are coupled to a supporting wall on one end and to the barrier 204 on another end to define compartments for each conductor 124, 126, and 128. The compartments may electrically isolate the conductors 124, 126, and 128 from each other. In an embodiment, the side barriers 602, 604, 606, and 608 may be parallel to each other. In another embodiment, the side barriers 602, 604, 606, and 608 may converge towards or diverge away from each other. In an embodiment, a measurement of a longitudinal dimension of the side barriers 602, 604, 606, and 608 may be equal to the measurement of the longitudinal dimension of the barrier 204. In another embodiment, the side barriers 602, 604, 606, and 608 may be smaller than the barrier 204.

FIG. 9 is a graphical representation 900 of temperature change in electrical components for different ratios between the dimension (L) 220 of the barrier 204 and the spacing distance (B) 212, according to an embodiment of the present invention. A ratio (B/L) between the spacing distance 212 between the barrier 204 and the conductors 124, 126, and 128 and the dimension (L) 220 of the barrier 204 is plotted on the X-axis 902. A ratio (T*) of a difference (ΔT (with barrier 204)) in temperature of the conductors 124, 126, and 128 and the ambient temperature versus a difference (ΔT (without barrier 204)) in temperature of the conductors 124, 126, and 128 and the ambient temperature is plotted on the Y-axis 904. From the values of T* it can be determined whether the placement of the barrier 204 is appropriate to effect a reduction in temperature of the conductors 124, 126, and 128. T* can be calculated for each value of B/L over using Equation 1:

$$T^* = \frac{\Delta T \text{ (with barrier 204)}}{\Delta T \text{ (without barrier 204)}} \quad (1)$$

When the ratio T* is less than 1 for a particular B/L value it implies that the barrier 204 causes greater reduction in temperature of the conductors 124, 126, and 128 in comparison with temperature reduction when no barrier is placed in the cabinet 102. On the other hand, when the ratio T* is greater than 1 the barrier 204 has been placed such that it does not allow ambient air to reach the conductors 124, 126, and 128 thereby leading to slower cooling. The ratio T* is, thus, a representation of the effectiveness of the placement of the barrier 204 of a particular dimension (L) placed at a particular spacing distance (B) in maintaining the temperatures of the conductors 124, 126, and 128.

In the representation 900, plot 906 represents T* values for the dimension 220 of the barrier 204 equal to 20 cm. On plot 906, T* is equal to ~1 for B/L ratio of ~0.05. Further, T* is equal to ~0.95 for a B/L ratio of ~0.40. From the plot 906, it can be observed that the values of T* increase beyond B/L values of ~0.40. Similarly, plot 908 represents T* values for the dimension 220 of the barrier 204 equal to 100 cm. On plot 908, T* is equal to ~1 for a B/L ratio of ~0.05 and T* is ~0.90 for a B/L ratio of ~0.40. Plot 910, represents T* values for dimension 220 of the barrier 204 equal to 200 cm. T* value on the plot 910 for a B/L ratio of ~0.05 is equal to ~0.875 and is equal to ~0.89 for a B/L ratio of ~0.40.

Various embodiments described above thus provide for electrical equipment and a method for manufacturing the electrical equipment. The above-described embodiments of the equipment and method provide for an inexpensive way of cooling conductors in the equipment. The cooling efficiency of the equipment allows for a reduction in the size of conductors installed in the equipment. Further, the elimination of additional cooling components to cool the conductors reduces the size of the cabinet, thereby making the equipment compact and easy to handle. Some embodiments also electrically isolate conductors and reduce the possibility of arcing in the equipment.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting and are exemplary embodiments. Many other embodiments will be apparent to those of ordinary skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," etc. are used merely as labels, and are not intended to impose numerical or positional requirements on their objects.

This written description uses examples to disclose several embodiments of the invention, including the best mode, and also to enable any person of ordinary skill in the art to practice the embodiments of invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described electrical equipment and method of manufacturing, without departing from the spirit and scope of the invention herein involved, it is intended that all of the subject matter of the above description or shown in the accompanying drawings shall be interpreted merely as examples illustrating the inventive concept herein and shall not be construed as limiting the invention.

The invention claimed is:

1. An electrical equipment, comprising:
    a cabinet comprising a plurality of walls disposed around a plurality of electric components, wherein the plurality of electric components comprise a conductor;
    at least one barrier disposed in the cabinet and spaced apart from the conductor by a spacing distance to define a channel within the cabinet for air to flow between the barrier and the conductor, wherein a portion of the barrier is coupled to one of the plurality of walls of the cabinet; and
    a plurality of side barriers each comprising a plurality of sides, wherein one side of each of the plurality of side barriers is coupled to a supporting wall and another side of each side barrier is coupled to the at least one barrier to define at least one compartment surrounding at least a portion of the conductor;
    wherein at least one of the side barriers comprises a plurality of unobstructed perforations defined therethrough to allow an air jet to flow therethrough towards the conductor;
    wherein a ratio of a measurement of a longitudinal dimension of a side of the at least one barrier that is facing the conductor to the spacing distance is one of greater than 20 and less than 2.5.

2. The electrical equipment of claim 1, wherein the at least one barrier comprises a thermally insulating material.

3. The electrical equipment of claim 1, wherein the plurality of perforations are defined at regular intervals along the length of the barrier.

4. The electrical equipment of claim 1, wherein the spacing distance between the at least one barrier and the conductor is constant.

5. The electrical equipment of claim 1, wherein the spacing distance between the at least one barrier and the conductor varies along a dimension of the at least one barrier.

6. The electrical equipment of claim 1, wherein the at least one barrier comprises a venturi profile in which the spacing distance is at a minimum between a central region of the at least one barrier and the conductor and increases from the central region towards a plurality of ends of the at least one barrier along a dimension of the at least one harrier.

7. The electrical equipment of claim 1, wherein the conductor is placed on the supporting wall.

8. The electrical equipment of claim 1, wherein the plurality of side barriers are disposed such that a distance between any two of the plurality of side barriers changes along a portion of the spacing distance.

9. The electrical equipment of claim 1, wherein the conductor comprises a busbar.

10. The electrical equipment of claim 1, wherein at least one of the plurality of walls of the cabinet comprises an opening to allow ambient air to enter the channel between the at least one barrier and the conductor.

* * * * *